United States Patent
Cesura et al.

(10) Patent No.: US 6,867,718 B2
(45) Date of Patent: Mar. 15, 2005

(54) METHOD OF CORRECTION OF THE ERROR INTRODUCED BY A MULTIBIT DAC INCORPORATED IN AN ADC

(75) Inventors: Giovanni Cesura, Cremona (IT); Andrea Panigada, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/764,128

(22) Filed: Jan. 23, 2004

(65) Prior Publication Data

US 2004/0227650 A1 Nov. 18, 2004

(30) Foreign Application Priority Data

Jan. 24, 2003  (EP) .............................................. 03425032

(51) Int. Cl.[7] .................................................... H03M 1/06
(52) U.S. Cl. ...................................... 341/118; 341/120
(58) Field of Search .................................. 341/118, 120, 341/143, 155

(56) References Cited

U.S. PATENT DOCUMENTS 6,049,298 A  *  4/2000  Knudsen ...................... 341/118

2002/0041248 A1  4/2002  Galton

OTHER PUBLICATIONS

European Search Report dated Nov. 4, 2003 for European Application No. 03425032.4.

* cited by examiner

Primary Examiner—Brian Young
Assistant Examiner—Joseph Lauture
(74) Attorney, Agent, or Firm—Lisa K. Jorgenson; Jose Gutman; Fleit, Kain, Gibbons, Gutman, Bongini & Bianco P.L.

(57) ABSTRACT

A method corrects the error in an output digital signal (Out) of an analog/digital converter (ADC) (100), in which the error is introduced by a multibit digital/analog converter (DAC) (125) incorporated in the ADC. The method calculates (905) coefficients ($p_i, p_i r_i$) of a linear combination of vectors of a vector space representative of the error introduced by the DAC; calculates (910-1, ..., 910-7) the correlation of a signal (Res1$d$) containing the error introduced by the DAC, to extract an estimation of each vector; calculates a linear combination representative of the estimation of the error introduced by the DAC, and uses the estimation of the error introduced by the DAC to correct the ADC output signal.

8 Claims, 8 Drawing Sheets

METHOD OF CORRECTION OF THE ERROR INTRODUCED BY A MULTIBIT DAC INCORPORATED IN AN ADC

CROSS-REFERENCE TO RELATED APPLICATION

This application is based upon and claims priority from prior European Patent Application No. 03425032.4, filed on Jan. 24, 2003, the entire disclosure of which is herein incorporated by reference.

BACKGROUND OF THE INVENTION

1. Field of the Invention

The present invention relates in general to the field of analog/digital conversion circuits or converters (ADCs), particularly to ADCs featuring high resolution and wide band.

2. Description of the Related Art

In several typologies of ADCs, multibit digital/analog converters (DACs) are used. Examples are the ADCs with the so-called pipelined architecture, the ADCs with sigma-delta architecture with multibit quantizers, and the ADCs with MASH architecture.

The use of multibit DACs within an ADC is one of the techniques for increasing the overall ADC resolution.

A disadvantage in the implementation of these ADC structures is the error introduced in the converted signal by the multibit DACs. In particular, such error derives from the inevitable mutual differences between the one-bit conversion elements composing the multibit DAC, and translates in a non-linearity of the ADC.

Considering for instance a pipelined ADC, the linearity requirements for the multibit DAC located downstream the flash ADC in the first ADC stage coincide with those for the whole converter, since the linearity error introduced by the DAC acts in the same position as the signal to be converted. Mutual differences between the one-bit conversion elements of the multibit DAC, for instance formed by switched-capacitor circuits, cause the lowering of the signal/noise and distortion ratio (SNDR) and the reduction of the spurious-free dynamic range (SFDR) of the ADC, because of the appearance of a harmonic distortion.

In order to try and obviate to the distortion problems introduced by the differences between the one-bit conversion elements of the multibit DACs, permutation or, in jargon, scrambling techniques of the input signals to the DACs have been proposed.

Thanks to these techniques, the effects of harmonic distortion are significantly reduced, and the SFDR is improved; nevertheless, the background noise raises since, because of the scrambling, the energy that would be concentrated in the harmonic components of the signal is spread over the whole signal spectrum. Such raising of the background noise is less acceptable the higher the desired resolution of the ADC.

US 2002/0041248 A1 describes a method of cancellation of the error introduced by the DAC of the first stage of a pipelined ADC. The DAC includes a digital encoder that randomly permutes the connections between the outputs of the flash ADC and the one-bit conversion elements of the DAC. A digital noise cancellation logic circuit for the cancellation of the noise introduced by the DAC is provided; such circuit receives the random bits controlling the encoder, parity bits and the digital residue sum of the digital outputs of the stages downstream, and produces an estimation of the error introduced by the first stage. Such estimation, subtracted from the digital signal produced by the stages downstream, is calculated by performing an average over a number of samples equal to at least $2^{25}$.

In such a document, the noise estimation is made possible thanks to the adoption of a well precise and rigid permutation law of the connections between the outputs of the flash ADC and the one-bit conversion elements of the DAC.

The Applicant has observed that the method of error cancellation described in such document involves a rather high circuit complexity.

The Applicant has also observed that the method of error estimation described in such a document, requiring an average over a very large number of samples, is rather slow. The time required by ADC output to converge to the corrected value is therefore rather long. For instance, if the ADC operates at a frequency of 80 MHz, the convergence time could be of the order of 1 second.

Accordingly, there exists a need for overcoming the disadvantages of the prior art as discussed above.

SUMMARY OF THE INVENTION

In view of the state of the art outlined above, it has been an object of the present invention to provide a method of correction of the linearity error generated by a multibit DAC embedded in an ADC.

According to the present invention, this and other objects have been attained thanks to the error correction method set forth in claim 1, comprising in brief:

providing a scrambling scheme of input signals to the DAC, defining a scrambling of the input signals depending on values of a group of variables, so as to produce scrambled input signals;

extrapolating from the scrambling scheme parameters defining a transformation operated by the scrambling scheme on the input signals to obtain the scrambled input signals;

assigning to the variables values substantially uncorrelated to each other;

based on the parameters, the substantially uncorrelated values and the scrambled signals, calculating coefficients of a linear combination of vectors of a vector space, the linear combination of vectors corresponding to a vector of the vector space representative of the error introduced by the DAC;

calculating the correlation of a signal containing the error introduced by the multibit DAC with each coefficient of the linear combination of vectors, to extract an estimation of each of the vectors;

on the base of the coefficients and of the estimation of the vectors, calculating a linear combination representative of the estimation of the error introduced by the DAC; and using the estimation of the error introduced by the DAC for correcting the output signal of the ADC.

BRIEF DESCRIPTION OF THE DRAWING

The features and advantages of the present invention will be made apparent by the following detailed description of an embodiment thereof, provided merely by way of non-limitative example, that will be made referring to the drawing sheets, wherein.

DESCRIPTION OF THE PREFERRED EMBODIMENTS

Figure 1:
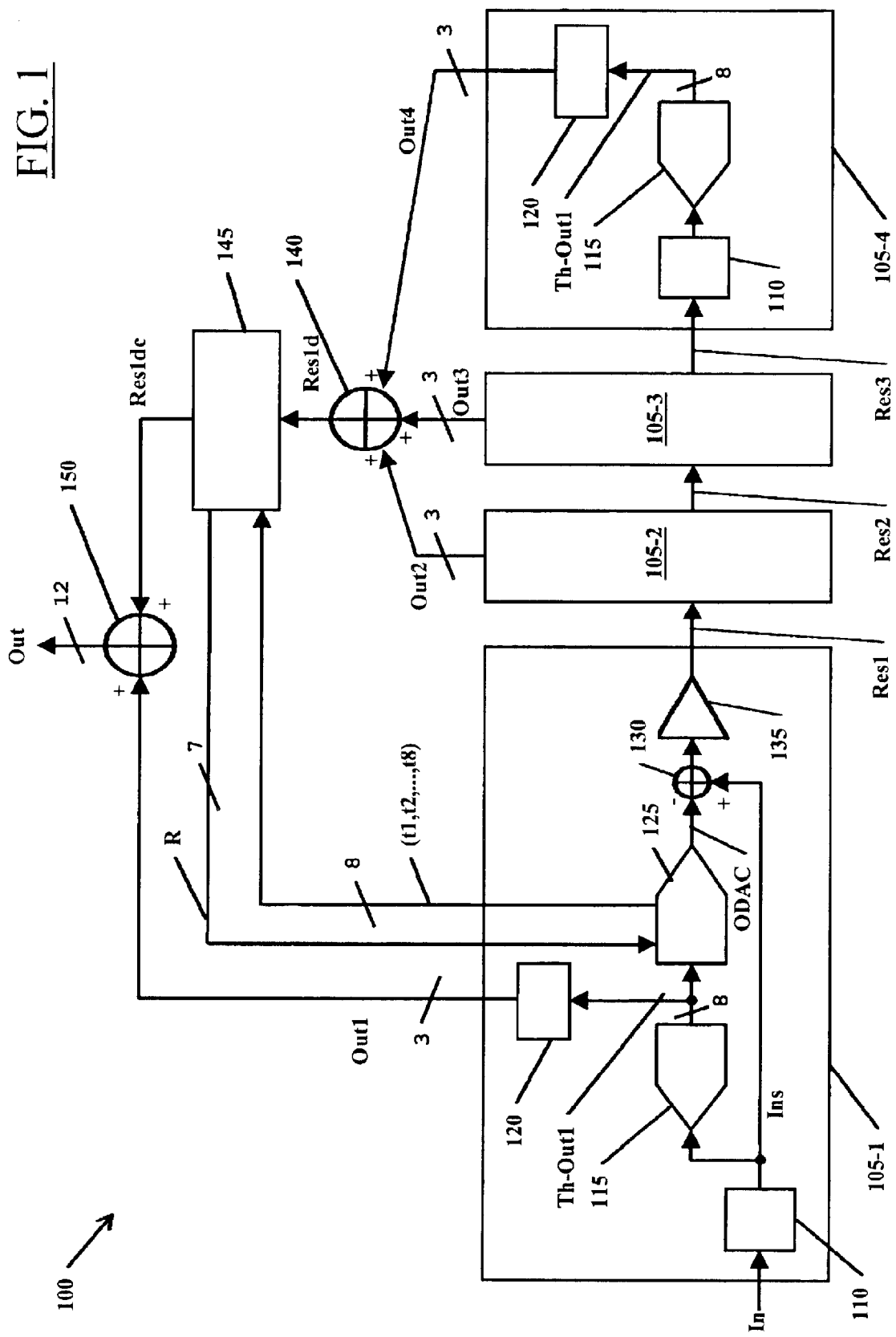
FIG. 1 is functional block diagram of a multistage pipelined ADC according to an embodiment of the present invention.

With reference to the drawings, a functional block diagram of a multistage pipelined ADC according to an embodiment of the present invention is shown in FIG. 1.

The pipelined ADC, globally identified by 100, receives in input an analog signal In, for instance an electric voltage, and provides at the output thereof a corresponding digital signal Out, constituted by a prescribed number of bits, representing the binary-coded value of the input signal In.

The pipelined ADC includes a plurality of cascaded analog/digital conversion stages, each stage having a respective conversion resolution. In this description, for the sake of simplicity, it will be assumed that the pipelined ADC includes four stages 105-1, 105-2, 105-3 and 105-4, each having a conversion resolution equal to three bits, so that the ADC 100 has a relatively low overall resolution of nine bits; it is however noted that the beneficial effects of the error estimation and correction method are appreciated the better the higher the resolution of the ADC; in particular, such beneficial effects can be clearly appreciated in ADCs with resolution equal to or higher than thirteen bits.

The first stage 105-1 receives the analog input signal In, performs an analog/digital conversion thereof with resolution of three bits, producing a digital signal Out1 of three bits, and feeds the second stage 105-2 with a first residual analog signal Res1, equal to the difference between the analog input signal In and an analog signal corresponding to the digital signal Out1. The second stage 105-2 performs on the residual analog signal Res1 the same operations that the first stage 105-1 performs on the analog input signal In, producing a digital signal Out2 of three bits and a second residual analog signal Res2. Likewise, the third stage 105-3 receives the second residual analog signal Res2, performs an analog/digital conversion thereof with resolution of three bits producing a digital signal Out3 of three bits, and feeds the fourth stage 105-4 with a third residual analog signal Res3, equal to the difference between the second residual analog signal Res2 and an analog signal corresponding to the digital signal Out3. The fourth and last stage 105-4 receives the third residual analog signal Res3 and performs an analog/digital conversion thereof with resolution of three bits, producing a digital signal Out4 of three bits.

In greater detail, the first stage 105-1 includes a sample-and-hold circuit 110, periodically sampling the analog input signal In. An output Ins of the sample-and-hold circuit 110, or sampled analog signal, representing the value of the analog input signal In at a given sampling instant, is fed to a nine-levels flash ADC 115; conventionally, the flash ADC 115 includes eight comparator circuits, for instance voltage comparators, that compare the sampled analog signal Ins to a set of eight voltage references. The output Th-Out1 of the flash ADC 115, comprising eight digital signals, is made up of the output of the eight comparator circuits of the ADC 115, and provides what in jargon is called a thermometric representation or coding of the converted sampled analog signal. The thermometric coded output Th-Out1 of the ADC 115 is fed to a thermometric-binary converter 120, that converts the thermometric representation of the converted analog signal into a binary representation, for instance in two's complement, producing the digital signal Out1. The thermometric coded output Th-Out1 of the ADC 115 is also fed to a nine-levels multibit DAC 125, comprising eight single-bit DACs, for instance of the switched-capacitor type. The output ODAC of the DAC 125 is an analog signal derived from the digital/analog conversion of the thermometric coded output Th-Out1 of the ADC 115; the output ODAC of the DAC 125 is subtracted from the sampled analog signal Ins in a subtractor circuit 130; the difference analog signal thus obtained is fed to an interstage amplifier 135, that outputs the residual analog signal Res1 fed to the second stage 105-2.

The stages 105-2 and 105-3 have a structure similar to that of the first stage 105-1: the respective digital signals Out2 and Out3 and the respective residual analog signals Res2 and Res3 are produced in way similar to the digital signal Out1 and the residual analog signal Res1.

The fourth and last stage 105-4 of the ADC 1 differs from the stages upstream in that it only comprises the sample-and-hold circuit 110, the ADC 115 and the thermometric-binary converter 120, that converts the thermometric coded output Th-Out4 of the respective ADC 115 into the digital signal Out4, without including the elements for the generation of the residual analog signal.

The digital signals Out2, Out3 and Out4 are added in an adder 140, that provides a sum digital signal Res1$d$, constituting a digital representation of the residual analog signal Res1 of the first stage 105-1.

The one-bit conversion elements of the DAC 125 (i.e., the different single-bit DACs that compose the multibit DAC) should ideally be identical to each other. Nevertheless, in the practice such one-bit conversion elements of the multibit DAC 125 inevitably show mutual differences, that make them more or less different from one another; for instance, in an implementation of the DAC 125 by means of switched-capacitor circuits, it is not possible to have condensers with identical capacitance values. Such mutual differences between the one-bit elements of the DAC 125 introduce an error, referred to as linearity error or distortion, in the digital/analog conversion of the thermometric coded digital signal Th-Out1. The linearity error introduced by the DAC 125 affects the residual analog signal Res1, and therefore the digital signal Resd1, constituting the digital conversion thereof. In particular, indicating as $E_{DAC}$ the linearity error caused by the DAC 125 and as G the gain of the interstage amplifier 135 of the first stage 105-1, the residual analog signal Res1 can be expressed as:

$$Res1 = -G(eq + E_{DAC})$$

where eq is the quantization error of the first stage 105-1 of the ADC 1.

In order to correct the linearity error $E_{DAC}$, the digital signal Res1$d$ is fed to a block 145 of estimation and correction of the linearity error introduced by the DAC 125 of the first stage 105-1. The error estimation and correction block 145 provides a digital signal Res1dc, constituting a digital representation of the residual analog signal Res1 substantially freed of the linearity error introduced by the DAC 125.

The digital signal Out1 provided by the first stage 105-1 and the digital signal Res1dc provided by the block 145 are added to each other in an adder 150, to generate the output digital signal Out of the ADC 100.

Figure 2:
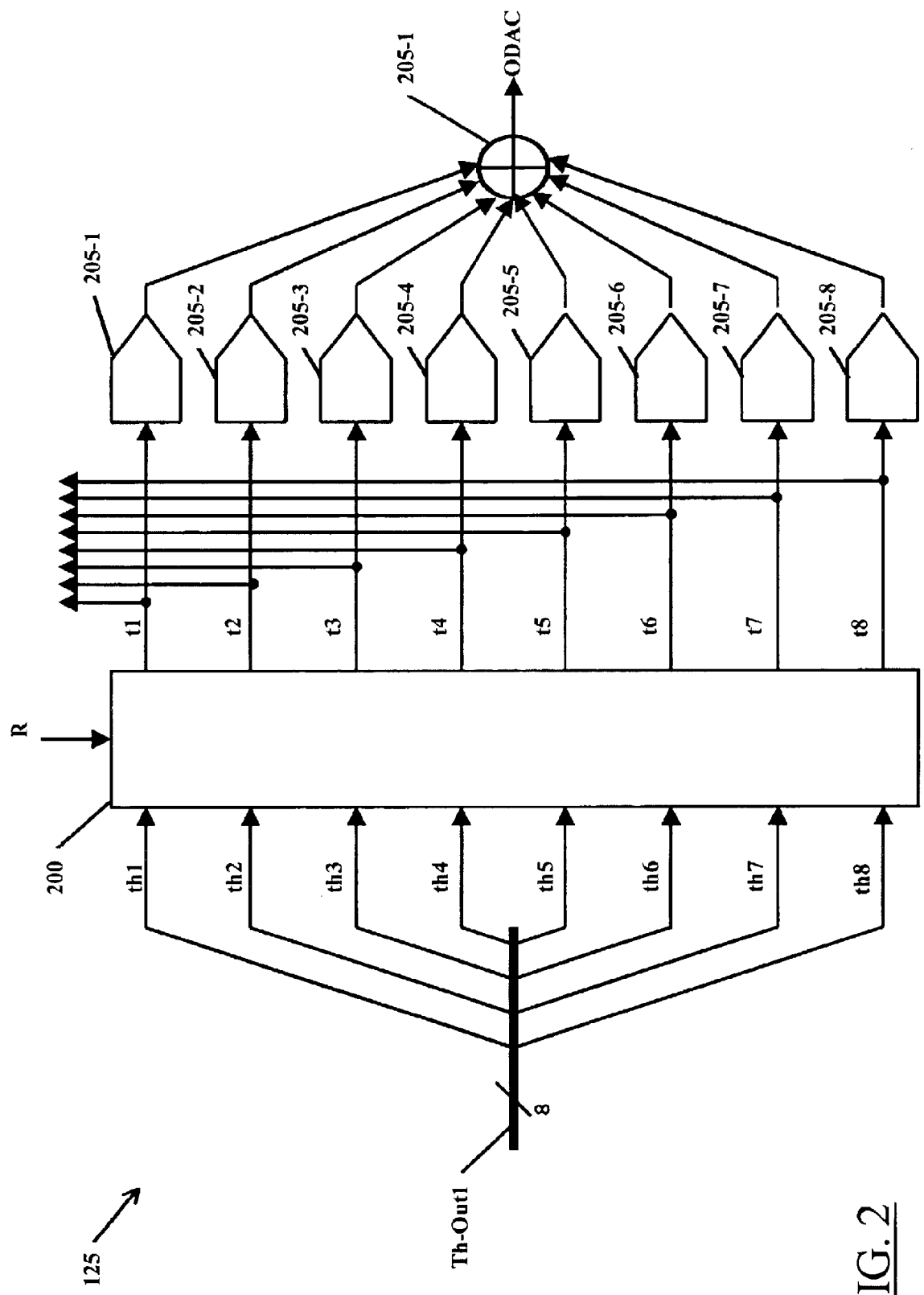
FIG. 2 is a block diagram of a multibit DAC incorporated in the first stage of the ADC of FIG. 1.

FIG. 2 is a more detailed view of the DAC 125. The eight signals th1–th8 constituting the thermometric coded digital signal Th-Out1 produced by the ADC 115 are fed to a permutation or scrambling block 200. The scrambling block 200 performs a scrambling of the eight signals th1–th8, according to a given law and depending on the values of a group R of variables, generated for instance by the estimation and correction block 145. Particularly, the values assigned to the variable of the group R are substantially random or pseudorandom, so that the scrambling of the signals performed by the scrambling block 200 is substantially random. The scrambling block 200 outputs eight signals t1–t8, constituting a scrambled representation of the original eight signals th1–th8; each of the eight signals t1–t8 is fed to a respective single-bit DAC, or one-bit conversion element of the multibit DAC 125, 205-1–205-8. The outputs of the eight DACs 205-1–205-8, added to each other in an adder 210, form the output signal ODAC of the DAC 125.

The scrambling block 200, performing a scrambling of the signals th1–th8 in dependence of the pseudorandom values of the variables of the group R, avoids that a rigid association exists between any given combination of "1"s and "0"s in the digital signal Th-Out1 and the one-bit DACs 205-1–205-8. In other words, the scrambling block 200 substantially makes the association of a given DAC 205-1–205-8 with a given signal th1–th8 random. Thanks to the presence of the scrambling block 200, the harmonic distortion effect induced by the mutual differences between the one-bit conversion elements 205-1–205-8 of the DAC 125 is reduced.

According to the present invention, whichever the scrambling law implemented by the scrambling block 200, the error estimation and correction block 145 is able to estimate and correct the linearity error introduced by the DAC 125. The following theoretical discussion will enable to understand the error estimation and correction method according to the present invention.

In general, let it be supposed that the multibit DAC, whose linearity error needs to be estimated and, consequently, corrected, is made up of $2^B$ one-bit conversion elements $u_i$, with $i=1, 2, \ldots, 2^B$ (for instance, the eight DACs 205-1–205-8 of FIG. 2, in which B=3). If the DAC were ideal, each one of the one-bit conversion elements us would have a value equal to 1; in the practice, with each one-bit conversion element a respective error $e_i$ is actually associated, whose value is defined as $$e_i = u_i - u_v$$

where $u_v$ identifies the average value of the one-bit conversion elements $u_i$:

$$u_v = \frac{1}{2^B} \sum_{i=1}^{2^B} u_i$$

The value $e_i$ defines therefore the error committed by the $i^{th}$ one-bit conversion element $u_i$ of the multibit DAC.

It is observed that the error is not referred to the ideal value (equal to 1) of the one-bit conversion element of the multibit DAC, but to the average value $u_v$ of all the one-bit conversion elements of the DAC; with such definition of the error of the generic one-bit conversion element, the generic error of the multibit DAC, that is produced when all the one-bit conversion elements of the DAC are used (i.e., when the DAC has to convert an input digital code t1=t2= . . . =t8="1") is:

$$\sum_{i=1}^{2^B} e_i = \sum_{i=1}^{2^B} (u_i - u_v) = \sum_{i=1}^{2^B} u_i - 2^B u_v = 0 \quad \text{(EQ. 1)}$$

In other words, the so-called gain error of the multibit DAC, due to the fact that the average of the values of the one-bit conversion elements is not equal to 1 but to a different value $u_v$, is not taken in consideration. However, such a gain error does not contribute to the linearity error $E_{DAC}$.

Based on the previous definition of the error $e_i$ committed by the $i^{th}$ one-bit conversion element $u_i$ of the multibit DAC, the generic linearity error $E_{DAC}$ can be represented by a linear combination of the single errors $e_i$:

$$E_{DAC} = \sum_{i=1}^{2^B} t_i e_i$$

where the coefficients $t_i$ of the linear combination have values equal to 0 or +1 depending on whether the $i^{th}$ one-bit conversion element of the DAC has to convert a logic "0" or a logic "1". With reference to FIG. 2, the group of coefficients $t_i$ constitutes therefore the thermometric coded digital signal Th-Out1 produced by the ADC 115 and scrambled by the scrambling block 200, i.e. the digital signals t1–t8.

From the previous equation EQ. 1 it can also be deduced that:

$$e_{2^B} = \sum_{i=1}^{2^B-1} e_i$$

that is, the dimension of the vector space of the errors $e_i$ is equal to $2^B-1$. The linearity error $E_{DAC}$ can thus be rewritten in the form:

$$E_{DAC} = \sum_{i=1}^{2^B-1} \tau_i e_i \quad \text{(EQ. 2)}$$

where $\tau_i = t_i - t_{2^B}$, with $i=1, 2, \ldots, 2^B-1$, identifies the new $i^{th}$ coefficient of the new linear combination. Based on the theory of vector spaces, this means that it is possible to represent the linearity error $E_{DAC}$ as a vector of a vector space of dimension $2^B-1$, of which a base of vectors $\beta = \{e_1, e_2, \ldots, e_{2^B-1}\}$ and the respective coefficients $\tau_i$ are known.

Still from the theory of vector spaces, it is known that a bilinear transformation realizing a change of vectors base from the base $\beta$ to a new base $\beta'$ through an invertible matrix M, allows again to represent the error $E_{DAC}$ as vector of the vector space with base of vectors $\beta' = \{e'_1, e'_2, \ldots, e'_{2^B-1}\}$, where the vectors of the two bases $\beta$ and $\beta'$ are related by the followings relationships:

$$M \cdot \begin{bmatrix} e_1 \\ e_2 \\ \vdots \\ e_{2^B-1} \end{bmatrix} = \begin{bmatrix} e'_1 \\ e'_2 \\ \vdots \\ e'_{2^B-1} \end{bmatrix} \quad \text{(EQ. 3)}$$

$$M^{-1} \cdot \begin{bmatrix} e'_1 \\ e'_2 \\ \vdots \\ e'_{2^B-1} \end{bmatrix} = \begin{bmatrix} e_1 \\ e_2 \\ \vdots \\ e_{2^B-1} \end{bmatrix}$$

being $M^{-1}$ the inverse matrix of the matrix M. In any case, and for any base of vectors chosen, once the vectors of the base are known, any linearity error $E_{DAC}$ committed by the multibit DAC is known (and it can therefore be corrected); from the equations EQ. 2 and EQ. 3 it results in fact:

$$E_{DAC} = [\tau_1 \ \tau_2 \ \ldots \ \tau_{2^B-1}] \cdot \begin{bmatrix} e_1 \\ e_2 \\ \vdots \\ e_{2^B-1} \end{bmatrix} \quad \text{(EQ. 4)}$$

$$= [\tau_1 \ \tau_2 \ \ldots \ \tau_{2^B-1}] \cdot M^{-1} \cdot \begin{bmatrix} e'_1 \\ e'_2 \\ \vdots \\ e'_{2^B-1} \end{bmatrix}$$

$$= [\tau'_1 \ \tau'_2 \ \ldots \ \tau'_{2^B-1}] \cdot \begin{bmatrix} e'_1 \\ e'_2 \\ \vdots \\ e'_{2^B-1} \end{bmatrix}$$

where $\tau'_i (i=1, 2, \ldots, 2^B-1)$ are the coefficients of the linear combination in the new base of vectors $\beta'$, obtainable from the coefficients $\tau_i$ by means of a matrix product thereof by the inverse matrix $M^{-1}$.

According to the present invention, the random or substantially random scrambling performed by the scrambling block 200 is therefore assimilated to a bilinear transformation, represented by an invertible matrix M; known the matrix M and known the pseudorandom variables, it is possible to represent the linearity error $E_{DAC}$ committed by the multibit DAC 125 in a new base of vectors $\beta'$ in which each coefficient $\tau'_i$ of the linear combination contains, in addition to the information on the analog-converted digital signal converted from the DAC 125, the information on the random or substantially random values of the variables R; operating such transformation, and calculating the coefficients of the linear combination, the estimation and correction block 145 will be able to extract the estimation of each vector $e'_i$ of the new base, and therefore to estimate the linearity error $E_{DAC}$.

In fact, the new coefficients $\tau'_i$ of the linear combination can be rewritten as:

$$[\tau'_1 \ \tau'_2 \ \ldots \ \tau'_{2^B-1}] = \quad \text{(EQ. 5)}$$

-continued $$[p_1 \ p_2 \ \ldots \ p_{2^B-1}] \cdot \begin{bmatrix} r_1 & 0 & 0 & \ldots & 0 \\ 0 & r_2 & 0 & \ldots & 0 \\ 0 & 0 & r_3 & \ldots & 0 \\ 0 & 0 & 0 & \ldots & 0 \\ 0 & 0 & 0 & \ldots & r_{2^B-1} \end{bmatrix}$$

where the diagonal matrix R:

$$R = \begin{bmatrix} r_1 & 0 & 0 & \ldots & 0 \\ 0 & r_2 & 0 & \ldots & 0 \\ 0 & 0 & r_3 & \ldots & 0 \\ 0 & 0 & 0 & \ldots & 0 \\ 0 & 0 & 0 & \ldots & r_{2^B-1} \end{bmatrix}$$

contains the random or substantially random values assigned to the variables of the group R, and the vector $P=[p_1 \ p_2 \ \ldots \ p_{2^B-1}]$ contains the information related to the signal, and is obtainable from the equations EQ. 4 and EQ. 5 as:

$$P = [\tau_1 \tau_2 \ldots \tau_{2^B-1}] \cdot M^{-1} \cdot R^{-1}$$

being $R^{-1}$ the inverse matrix of the diagonal matrix R.

It is observed that, from a mathematical point of view, any matrix M can be used, but not all the matrixes can be practically implemented in simple and fast way; on the other hand, the scrambling performed by the scrambling block 200 has to be relatively fast.

Thanks to such transformation, the linearity error $E_{DAC}$ can be expressed as:

$$E_{DAC} = \sum_{i=1}^{2^B-1} p_i \cdot r_i \cdot e'_i$$

so that the residual analog signal Res1 can be expressed as:

$$Res1 = -G \left( eq + \sum_{i=1}^{2^B-1} p_i \cdot r_i \cdot e'_i \right)$$

A method according to the present invention will now be described for the generation and implementation of scrambling blocks of the thermometric coded digital signal produced by the ADC 115, adapted to allow the estimation and the correction of the linearity error.

In the following, for the sake of simplicity, it will be assumed that the generic variable $r_i$ of the group R can take the mutually exclusive values +1 and −1.

The scrambling block 200 is in general composed by a number of scrambling stages equal to the number of digital signals constituting the thermometric coded digital signal Th-Out1 provided by the ADC 115, minus one; such scrambling stages are connected in cascade in a tree configuration.

The first scrambling stage receives the thermometric code outputted by the ADC 115, i.e. the signals making up the signal Th-Out1.

One scrambling law whatsoever is identified, to modify the order of the bits in the signal Th-Out1, and therefore the position of the logic "1"s presents in the thermometric code outputted by the ADC. Such scrambling law, that can be whatsoever, has however to be such as to allow two mutually exclusive solutions, and the choice of one or the other of the two solutions has to depend on the value (+1 or −1) taken by a respective variable $r_1$ of the group R.

A grouping criterion is then identified for grouping the bits outputted by the first scrambling stage. Also such criterion can be whatsoever, but it has however to allow grouping the bits at the output of the first scrambling stage in two separated subsets, independently from the value taken by the variable $r_1$, i.e. independently from the type of solution of the aforesaid scrambling law.

The two separated subsets of bits are each fed to a respective scrambling stage downstream, that performs the same function of the first stage on the basis of the value of a respective variable of the group R, but on half the number of bits.

In a similar way, one goes on until the two separated subsets of bits contain one element only each. It can be appreciated that, as already mentioned, the number of necessary scrambling stages and the number of variables of the group R are both equal to $2^B-1$, where B is the number of bits resolved by the DAC 125, i.e. the number signals constituting the thermometric code outputted by the ADC 115.

Once the scrambling block 200 is built in the way just described, a graph identifying the interconnections of the various scrambling stages of the block 200 is built; such a graph describes the path that the first bit (th1 in the example of FIG. 2) of the thermometric code Th-Out1 inputted to the scrambling block 200 has to follow for reaching a prescribed position in the output code (t1–t8) from the scrambling block 200; the nodes of the graphs represent the scrambling stages of the scrambling block 200.

On the basis of the interconnections graph thus built, a matrix is built (matrix of incidence of the graph), of dimension $2^B-1 \times 2^B-1$, that corresponds to the above described inverse matrix $M^{-1}$. The $i^{th}$ row of the matrix thus built describes the path that the first bit th1 in the thermometric code Th-Out1 inputted to the scrambling block 200 has to follow for reaching the $i^{th}$ position in the output code. Once the nodes of the graph that the bit has to pass through for reaching the desired position are identified, on the $j^{th}$ column of the matrix a value equal to 1 or −1 is placed, according to the value that the variable $r_j$, associated with $j^{th}$ scrambling stage passed through, has to take for obtaining the desired path; on all the other matrix columns, corresponding to the nodes of the graph that are not passed through, a value equal to 0 is placed.

It is observed that the path to reach the $2^{B-th}$ position is not described.

The matrix thus built will be used by the estimation block 145 to estimate and correct the linearity error, as will be described in greater detail later on.

The method of construction of scrambling blocks just described in general terms will now be described in connection with three exemplary practical embodiments of the scrambling block 200.

Figure 3:
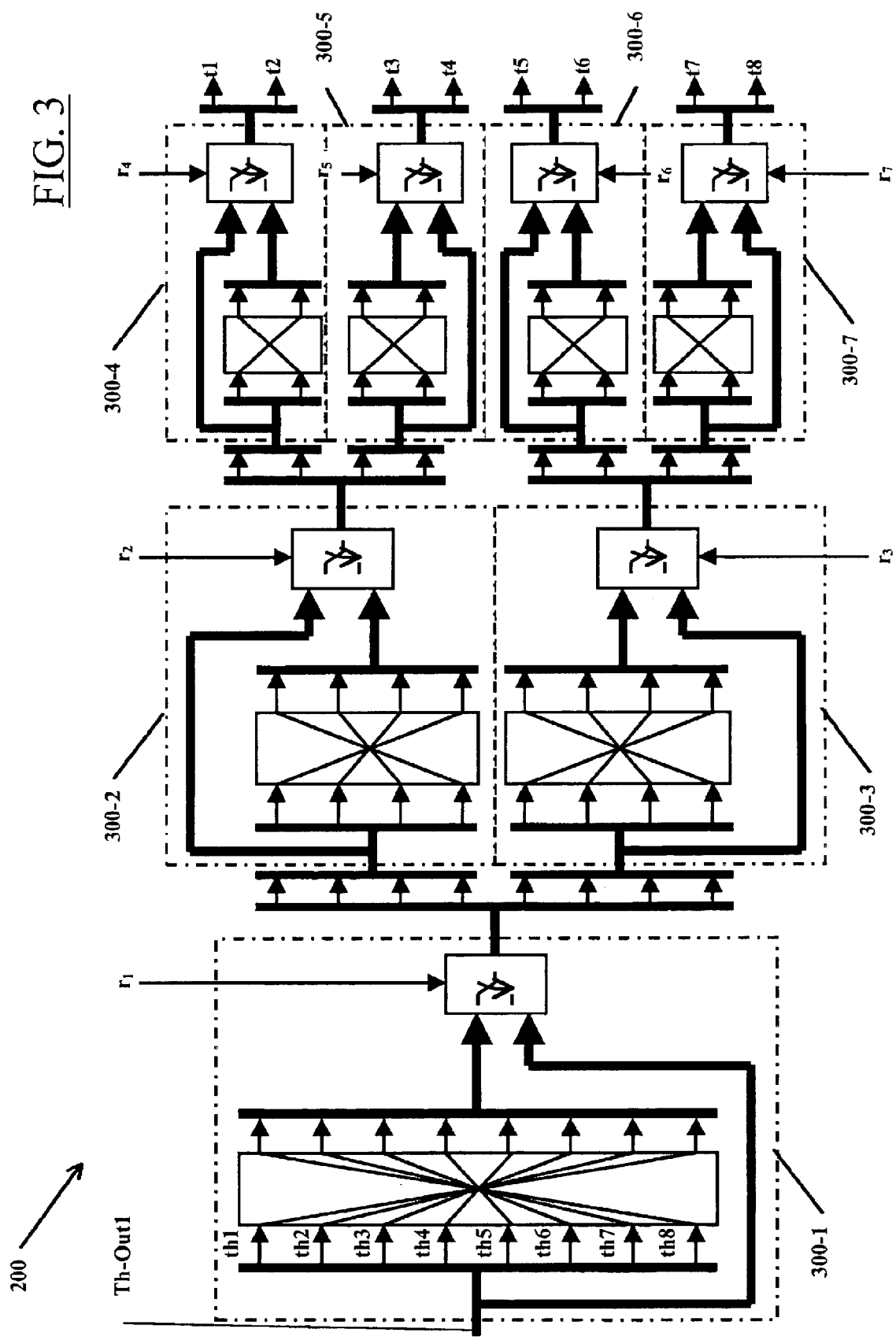
FIGS. 3, 5 and 7 schematically show three different implementations of a scrambling block of the input signals to the DAC of FIG. 2.

A first exemplary practical embodiment of scrambling block 200 is shown in FIG. 3. The scrambling block 200 includes seven scrambling stages 300-1–300-7, each one controlled by the value of a respective variable $r_1-r_7$ of the group R. The scrambling law used in the various scrambling stages is the following:

if the value of the generic $j^h$ variable $r_j$ is 1, then the sequence of bits outputted by the $j^{th}$ scrambling stage is the sequence of bit inputted to the stage taken in inverse order;

if the value of the generic $j^h$ variable $r_j$ is −1, then the sequence of bits outputted by $j^h$ scrambling stage coincides with the inputted sequence of bits.

The grouping criterion of the bits outputted by each scrambling stage calls for dividing the bits in two equal parts without modifying the order thereof.

Figure 4:
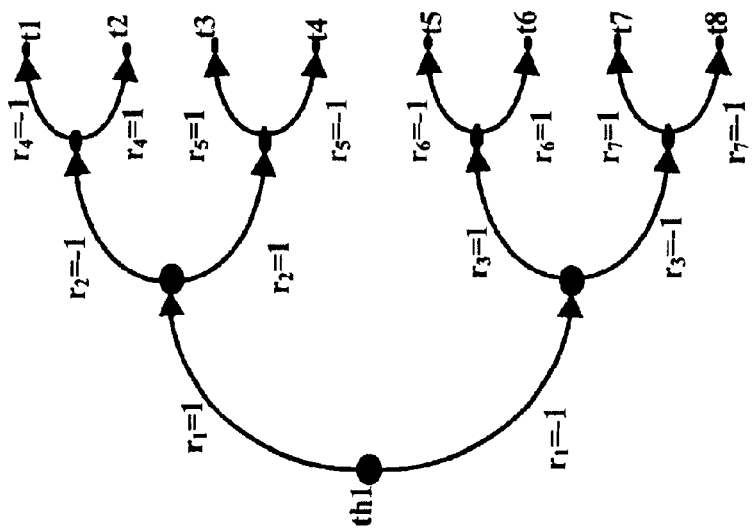

The interconnections graph obtainable from the scrambling block of FIG. 3 is shown in FIG. 4. On the basis of such interconnections graph, the following matrix of incidence is obtained, in the way described in the foregoing:

$$M^{-1} = \begin{bmatrix} 1 & -1 & 0 & -1 & 0 & 0 & 0 \\ 1 & -1 & 0 & 1 & 0 & 0 & 0 \\ 1 & 1 & 0 & 0 & 1 & 0 & 0 \\ 1 & 1 & 0 & 0 & -1 & 0 & 0 \\ -1 & 0 & 1 & 0 & 0 & -1 & 0 \\ -1 & 0 & 1 & 0 & 0 & 1 & 0 \\ -1 & 0 & -1 & 0 & 0 & 0 & 1 \end{bmatrix}$$

Figure 5:
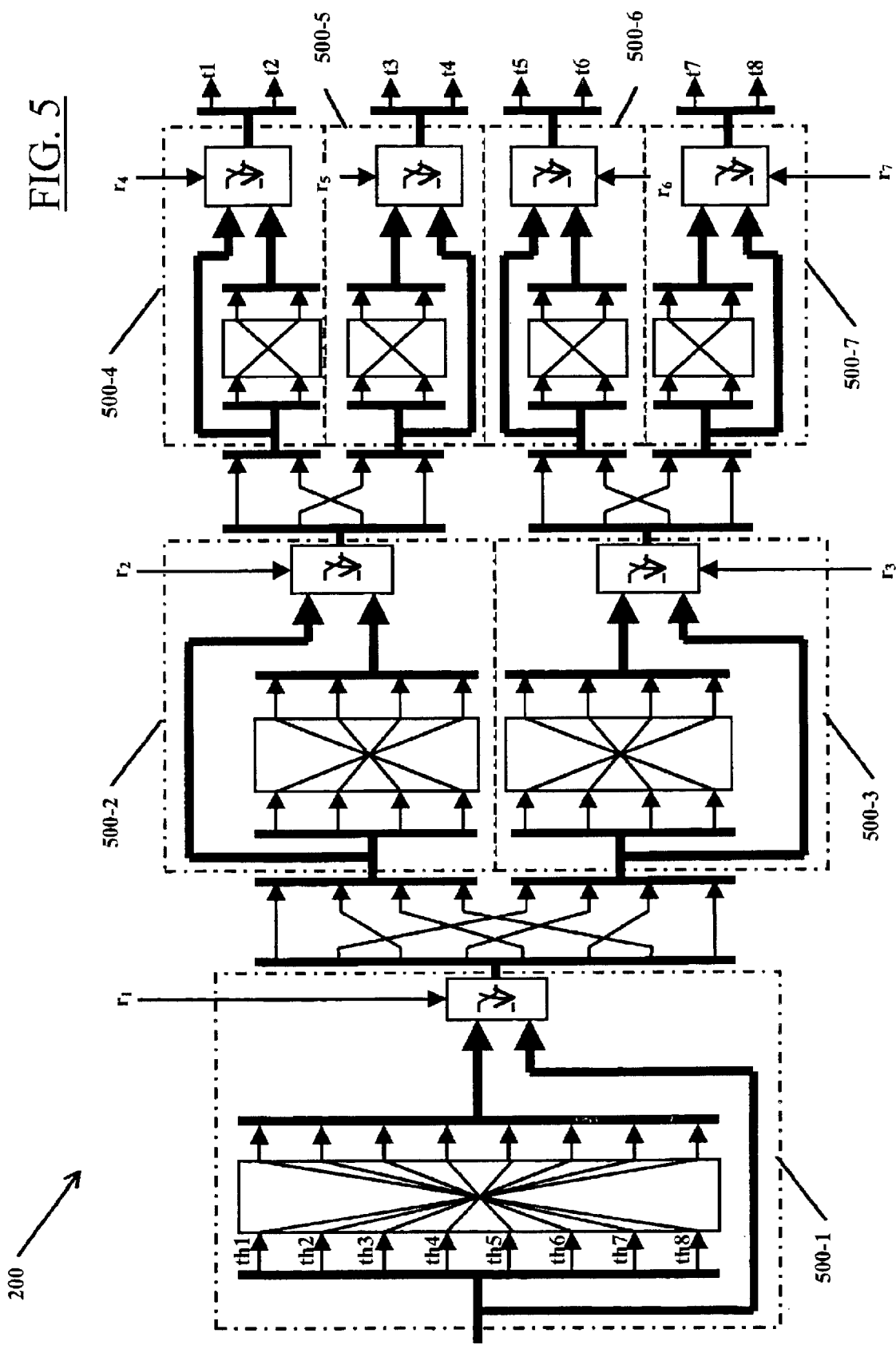

A second exemplary practical embodiment of scrambling block 200 is shown in FIG. 5. The scrambling block 200 includes again seven scrambling stages 500-1–500-7, each one controlled by the value of a respective variable $r_1-r_7$ of the group R. The scrambling law in the various scrambling stages is the same one used in the scrambling block of FIG. 3. Nevertheless, the grouping criterion of the bits outputted by each scrambling stage is a different one, in this case calling for the separation of the bits in even positions from those in odd positions.

Figure 6:
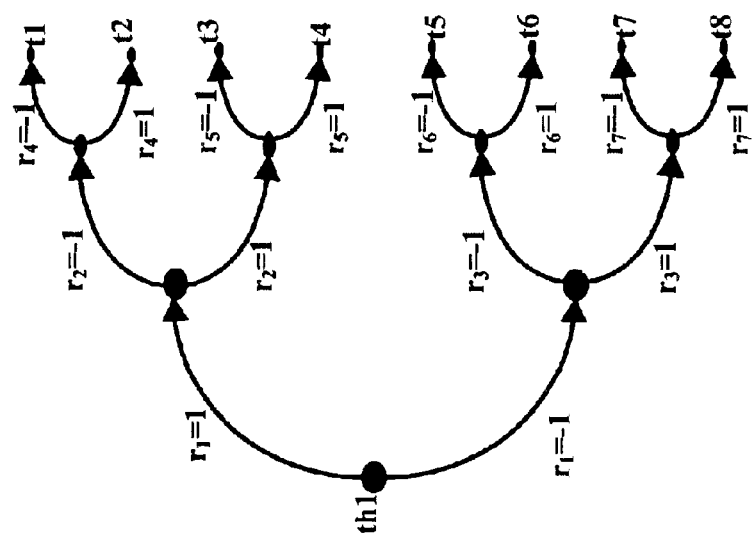

The interconnections graph obtainable from this scrambling block is shown in FIG. 6, and the following matrix of incidence is derived therefrom, in the way described in the foregoing:

$$M^{-1} = \begin{bmatrix} 1 & -1 & 0 & -1 & 0 & 0 & 0 \\ 1 & -1 & 0 & 1 & 0 & 0 & 0 \\ 1 & 1 & 0 & 0 & -1 & 0 & 0 \\ 1 & 1 & 0 & 0 & 1 & 0 & 0 \\ -1 & 0 & -1 & 0 & 0 & -1 & 0 \\ -1 & 0 & -1 & 0 & 0 & 1 & 0 \\ -1 & 0 & 1 & 0 & 0 & 0 & -1 \end{bmatrix}$$

Figure 7:
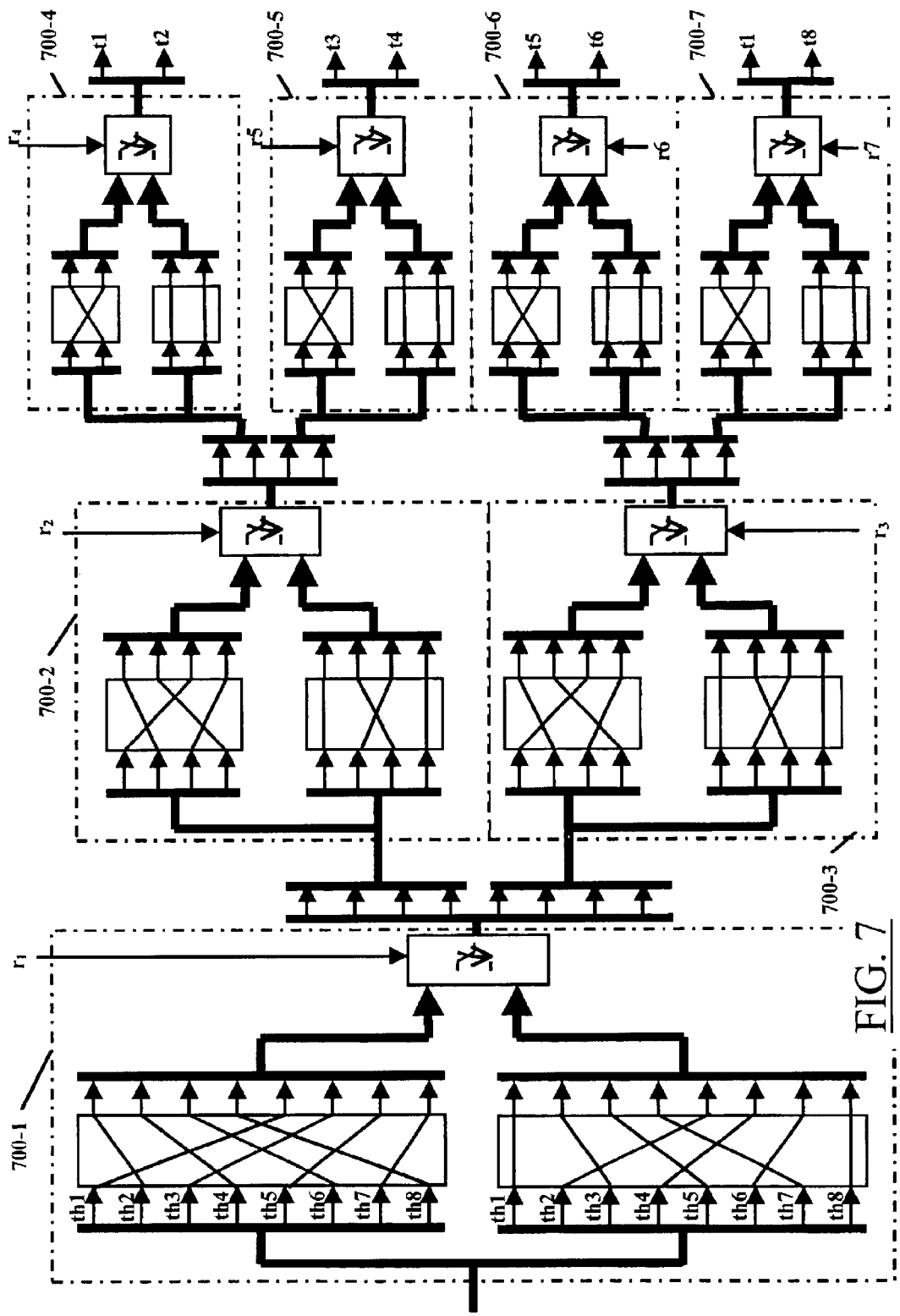

A third exemplary practical embodiment of scrambling block is shown in FIG. 7. The scrambling block 200 again includes seven scrambling stages 700-1–700-7, each one controlled by the value of a respective pseudorandom variable $r_1-r_7$ of the group R. The scrambling law used in the different scrambling stages is:

if $r_j=1$, it is selected the sequence of bits inputted to the $j^h$ scrambling stage in the order even-odd (starting from the least significant bit);

if $r_j=-1$, it is selected the sequence of bit inputted to the $j^h$ scrambling stage in the order odd-even (still starting from the least significant bit).

The grouping criterion of the bits outputted from each scrambling stage calls for dividing the bits in two equal parts without modifying the order thereof.

Figure 8:
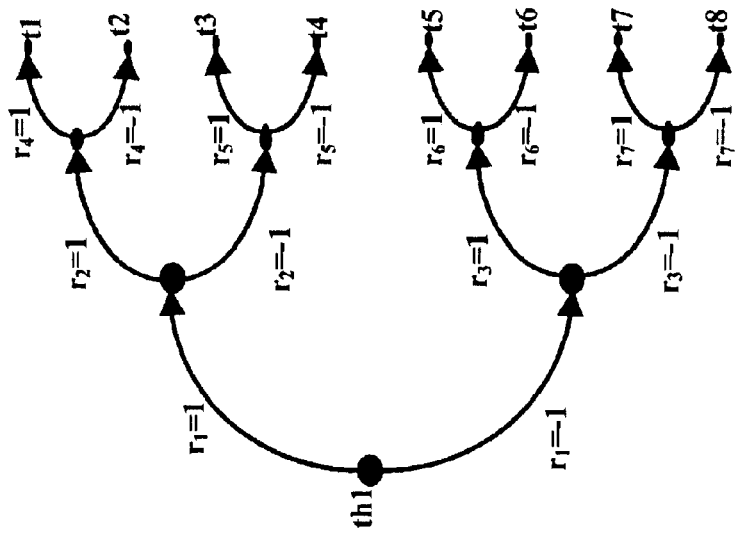
FIGS. 4, 6 and 8 show interconnection graphs derived by the scrambling blocks of FIGS. 3, 5 and 7, respectively, and used for building respective matrixes of parameters descriptive of the transformations operated by the scrambling blocks.

The interconnections graph obtainable from this scrambling block is shown in FIG. 8, and the following matrix of incidence is derived therefrom, in the way described in the foregoing:

$$M^{-1} = \begin{bmatrix} 1 & 1 & 0 & 1 & 0 & 0 & 0 \\ 1 & 1 & 0 & -1 & 0 & 0 & 0 \\ 1 & -1 & 0 & 0 & 1 & 0 & 0 \\ 1 & -1 & 0 & 0 & -1 & 0 & 0 \\ -1 & 0 & 1 & 0 & 0 & 1 & 0 \\ -1 & 0 & 1 & 0 & 0 & -1 & 0 \\ -1 & 0 & -1 & 0 & 0 & 0 & 1 \end{bmatrix}$$

For the practical implementation of the scrambling block, simple switches are required, controlled by the variables $r_1$–$r_7$, and a suitable routing of signals between the switches.

After having built the matrix of incidence $M^{-1}$, extrapolating it from the scrambling block 200 in the way previously described, such matrix (i.e., the parameters that compose it) is stored in the error estimation block 145. The error estimation block 145 also receives from the DAC 125 the signals $t_1, t_2, \ldots, t_8$ outputted by the scrambling block 200.

Figure 9:
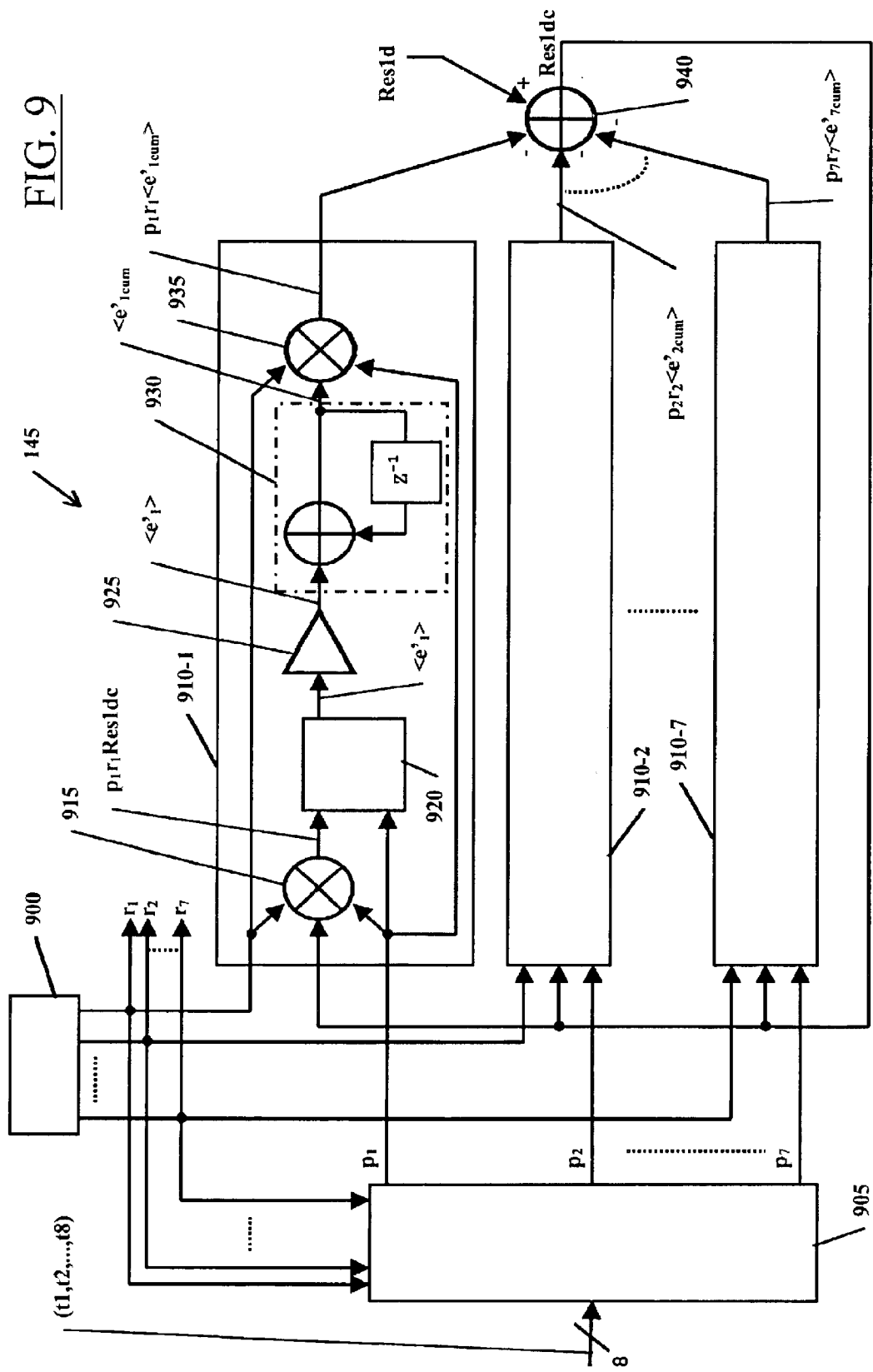
FIG. 9 is a functional block diagram of an estimation and correction unit of the error introduced by the DAC of FIG. 2, according to an embodiment of the present invention.

FIG. 9 shows, in terms of functional blocks, the error estimation block 145, in an embodiment of the present invention. A pseudorandom bit generator block 900 produces random or substantially random values to be assigned to the seven variables $r_1, r_2, \ldots, r_7$, that are fed to the DAC 125 to drive the stages of the scrambling block 200; the block 900 is for instance implemented by means of a pseudorandom number generator (also known as linear feedback shift register).

It is observed that, in general terms, the requirements on the values of the variables $r_1, r_2, \ldots, r_7$ are that they are uncorrelated to each other and to the input signal In to the ADC. The same variables $r_1, r_2, \ldots, r_7$ are also fed to an arithmetic calculation block 905, that additionally receives the eight signals $t_1, t_2, \ldots, t_8$ outputted by the scrambling block 200. On the basis of the signals $t_1, t_2, \ldots, t_8$, the arithmetic calculation block 905 calculates the values $\tau_1, \tau_2, \ldots, \tau_7$, where $\tau_i = t_i - t_2^B$ ($i=1, 2, \ldots, 2^B-1$), constituting the coefficients of the linear combination of the equation EQ. 2, i.e. the coefficients of the linear combination in the base of vectors β that represents, in the vector space, the vector identifying the error $E_{DAC}$. Starting from the values of the pseudorandom variables $r_1, r_2, \ldots, r_7$, the arithmetic calculation block 905 additionally calculates the matrix $R^{-1}$ (i.e., the inverse matrix of the diagonal matrix R containing the values of the pseudorandom variables $r_1, r_2, \ldots, r_7$), and, performing a matrix product, it determines the values $p_1, p_2, \ldots, p_7$, containing the information on the analog signal converted by the flash ADC 115. It is observed that although, in mathematical terms, the arithmetic calculation block 905 has to perform matrix calculations, in the practice the calculations that the block 905 has to perform may reduce to simple products and additions or subtractions. Moreover, choosing as possible values for the pseudorandom variables the values +1 and −1, the calculations that the block 905 has to perform may reduce to straight additions or subtractions; the block 905 can therefore be implemented by means of a suitable arrangement of adders, and the structure thereof is determined once that the matrix of incidence associated with the scrambling block 200 has been derived.

Each of the values $p_1, p_2, \ldots, p_7$ thus calculated is fed, together with the associated variable $r_1, r_2, \ldots, r_7$ and the signal Res1*dc*, outputted by the block 145, to a respective correlation block 910-1, 910-2, ..., 910-7. In the generic correlation block **910-*i*** (with i=1, 2, ..., 7), the respective value $p_i$, the respective pseudorandom variable $r_i$ and the signal Res1*dc* are multiplied in a multiplier 915 and the resulting product $p_i r_i$Res1*dc* is fed to a block 920 adapted to perform a weighted average of the product $p_i r_i$Res1*dc* over a prescribed number of sampling periods of the input signal In to the ADC 100 (therefore, on a prescribed number of samples of the input signal), for instance equal to 1024. The operations performed by the multiplier 915 and the block 920 correspond to an operation of correlation between the value $p_i$, the pseudorandom variable $r_i$ and the signal Res1*dc*; the block 920 extracts therefore from the signal Res1*dc* an estimation <e'i> of the generic vector component $e'_i$ of the error $E_{DAC}$.

In fact, considering the generic correlation block **910-*i***, since all the signals composing the signal Res1*dc* except the signal containing the error $e'_i$ are uncorrelated from the pseudorandom variables $r_i$, the output of the block 920 provides an approximate estimation <e'$_i$> of the component vector e'$_i$ of the error $E_{DAC}$. In the block 925, a weight factor μ is applied to the approximate estimation <e'$_i$>, and the weighted approximate estimation μ<e'$_i$> thus obtained is added, in an accumulator or integrator 930, to the weighted approximate estimations calculated in previous sampling periods. At the output of the integrator 930, an accumulated estimation <e'$_{icum}$> of the vector e'$_i$ is therefore made available, and such accumulated estimation is fed, together with the respective value $p_i$ and the respective pseudorandom variable $r_i$, to a multiplier 935 that therefore provides an estimation $p_i r_i$<e'$_{icum}$> of the j$^{th}$ component of the linear combination corresponding to the estimation <$E_{DAC}$> of the linearity error:

$$\langle E_{DAC} \rangle = \sum_{i=1}^{2^B-1} p_i \cdot r_i \cdot \langle e'_i \rangle$$

The estimations provided by the different correlation blocks 910-1, ..., 910-8 are then fed, together with the signal Res1*d*, to an adder 940; the adder 940 adds to each other the values provided by the different correlation blocks, and subtracts the value thus obtained from the signal Res1*d*, providing therefore the signal Res1*dc* equal to:

Res1*dc*=−G(eq+$E_{DAC}$−<$E_{DAC}$>)

In other words, each correlation block 910-1, ..., 910-8, through a correlation process, provides an estimation of a respective component of the linearity error $E_{DAC}$.

At the beginning of the estimation process, the value of the signal Res1*dc* coincides with that of the signal Res1*d*, because the estimated value <e'$_i$> for the generic error e'$_i$ is zero.

The signal Res1*dc*, i.e. the signal Res1*d* corrected, is fed back to the correlation blocks, so that the estimation is performed iteratively, producing more and more precise estimations of the respective component of the linearity error, converging toward a steady-state estimation that substantially coincides with the actual component of the error. After a sufficiently large number of sampling periods, the estimated value <e'$_{icum}$> tends to the real value of the error e'$_i$. However, after a relatively low number of sampling periods (for instance, 1024), an approximate estimation of the error is already available, that allows to operate a correction of the signal Res1*d*. Moreover, it is possible to track relatively fast variations of the error $E_{DAC}$, for instance due to thermal drifts of the components of the DAC 125.

Figure 10:
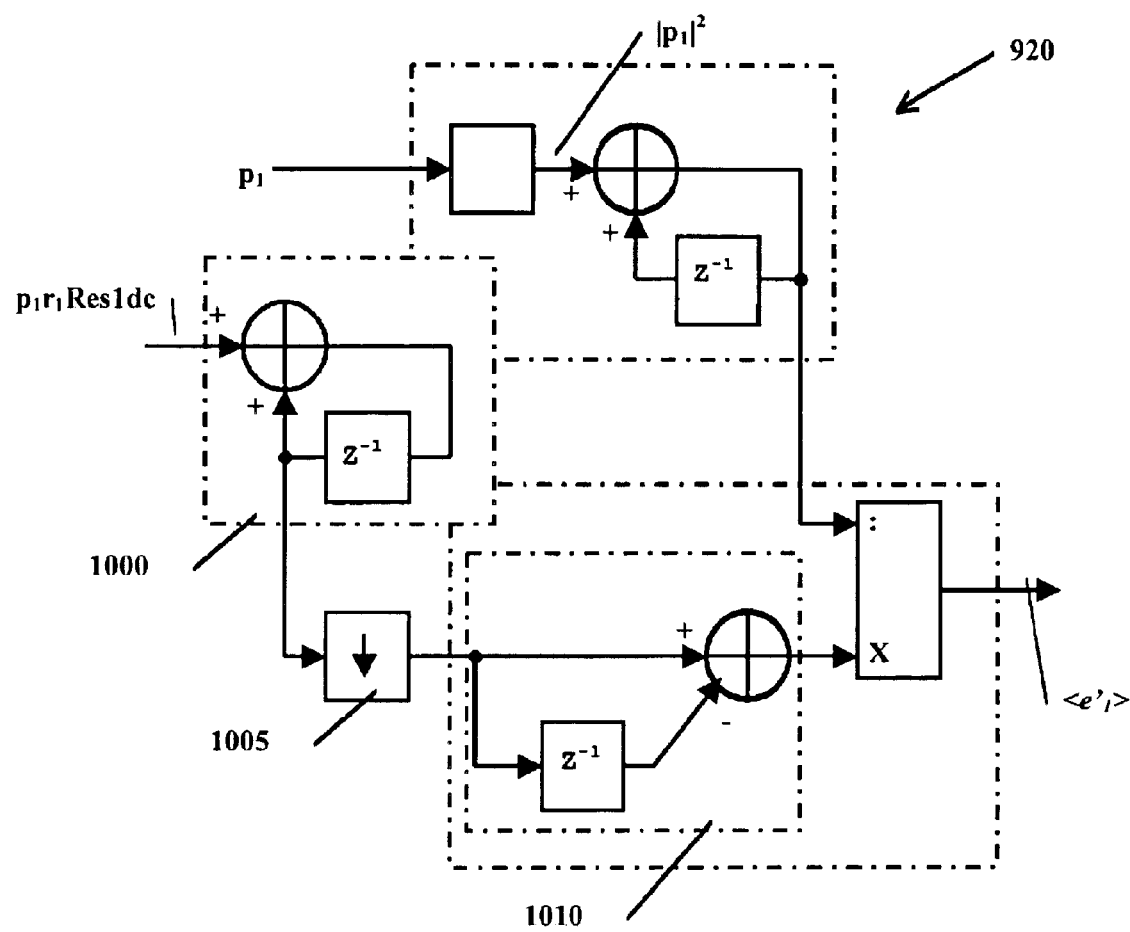
FIG. 10 is a functional block diagram of a weighted average calculation unit of the estimation and correction unit of FIG. 9, according to an embodiment of the present invention.

FIG. 10 shows a functional block diagram of the block 920 of FIG. 9, in an embodiment of the present invention. As it can be observed, it is a first-order filter, conceptually similar to a sinc filter, comprising an accumulator 1000 in which the values of the product $p_1r_1\text{Res}1dc$ are accumulated. The output of the accumulator 1000 is fed to a down-sampler block 1005, operating on the basis of a frequency equal to the sampling frequency of the input signal divided by a prescribed factor n, for example equal to 1024. At the output of the down-sampler block 1005, the value of the accumulator 1000 every n sampling periods is therefore available, for instance every 1024 periods. In a block 1010, the value of the accumulator 1000 at the generic sampling period k is then subtracted from the value of the accumulator at the sampling period k+n. Differently from a traditional first-order sinc filter, the average is not performed dividing the value provided by the block 1010 by the number n of sampling periods: the value provided by the block 1010 is instead normalized dividing it, in the block 1015, by the integral, calculated on the n sampling periods, of the square modulus of the value $p_i$, in this way, the convergence of the estimation of the errors takes place with one time constant only, adjustable through the weight factor $\mu$.

The higher the value of the weight factor $\mu$, the shorter the convergence time, and the lower the precision of the error estimation. In the practice, the weight factor $\mu$ can be chosen to have a value equal to a power of two, in the range $2^{-8}$ to $2^{-14}$; the specific value of the weight factor $\mu$ can be chosen by the designer on the basis of the ADC (e.g., on the resolution thereof).

The described error correction method has the advantage of not being limited to a fixed, rigid scrambling scheme of the thermometric coded signals outputted by the flash ADC 115. Any scrambling scheme can in principle be adopted.

Another advantage resides in the fact that the estimation of the error is performed iteratively, producing more and more precise estimations of the error, averaging over a relatively small number of sampling periods. This allows a relatively fast convergence of the ADC output signal toward the value purged by the error of the DAC, and also allows following dynamic variations of the DAC error. Simulations conducted by the Applicant have shown that, at a sampling frequency of 80 MHz, the time necessary for the convergence is lower than 50 ms.

A non-negligible aspect is that the above advantages, as well other advantages, are achieved with a relatively small circuit complexity.

It is pointed out that in the exemplary embodiment of the invention herein described, only the linearity errors produced by the first conversion stage of a pipelined ADC are corrected. Similar linearity errors are in principle introduced by the DACs incorporated in the stages downstream the first stage, although the influence of such errors decreases from a stage to the following one. In any case, if desired, it is possible to correct also the errors introduced by one or more stages downstream the first stage, providing in such stages a scrambling block of the thermometric code outputted by the respective flash ADC, upstream the respective DAC, and carrying out a correction of the residual analog signal outputted by such stages in the way above described in connection with the correction of the residual analog signal of the first stage.

Additionally, although described in connection with a pipelined ADC, the present invention can also find application in other types of ADC, for instance in sigma-delta or MASH architectures. For example, in the case of a multibit sigma-delta converter, the signal containing the error introduced by the multibit DAC, to be used for the estimation of the error, can be the output signal of the converter; in the case of a multistage MASH converter, having a first stage constituted by a multibit sigma-delta converter, the signal containing the error introduced by the multibit DAC, to be used for the estimation, can be the output signal of the first stage of the converter, i.e. the output signal of the sigma-delta converter. In general, for the estimation of the error introduced by a multibit DAC incorporated in an ADC, any digital signal produced by the ADC and that contains such error can be used.

The present invention is not limited to the examples described above. Many alternative embodiments are possible without departing from the scope defined by the appended claims. For example, it should be obvious to those of ordinary skill in the art in view of the present discussion that alternative embodiments of the new and novel circuit may be implemented in an integrated circuit comprising a circuit supporting substrate that supports at least a portion of the new and novel circuit discussed above. Additionally, the new and novel circuit may be implemented in a computing system comprising at least one such circuit thereby providing the advantages of the present invention to such computing system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of correction of an error in an output digital signal of an analog/digital converter (ADC), in which the error is introduced by a multibit digital/analog converter (DAC) incorporated in the ADC, comprising:

providing a scrambling scheme of input signals to the DAC, the scrambling scheme defining a scrambling of the input signals as a function of values of a group of variables, to produce scrambled input signals;

extrapolating from the scrambling scheme parameters defining a transformation operated by the scrambling scheme on the input signals to obtain the scrambled input signals;

assigning to the variables values substantially uncorrelated to each other;

on the basis of the parameters, of the substantially uncorrelated values and of the scrambled signals, calculating coefficients of a linear combination of vectors of a vector space, the linear combination of vectors corresponding to a vector of the vector space representative of the error introduced by the multibit DAC;

calculating a correlation of a signal containing the error introduced by the multibit DAC with each coefficient of the linear combination of vectors, to extract an estimation of each of the vectors;

on the basis of the coefficients and of the estimations of the vectors, calculating a linear combination representative of an estimation of the error introduced by the multibit DAC; and using the estimation of the error introduced by the multibit DAC to correct the output signal of the ADC.

2. The method according to claim 1, in which the calculating the correlation includes:
   a) calculating approximate estimations of each vector by calculating the correlation on a prescribed number of sampling periods,
   b) correcting the signal containing the error through the approximate estimations, and
   iterating the actions a) and b).

3. The method according to claim 2, in which the calculating approximate estimations includes, for each vector, calculating averages, on the prescribed number of sampling periods, of products of the coefficients by the signal containing the error.

4. The method according to claim 3, in which the calculating averages includes:
   accumulating in an accumulator the products;
   obtaining from the accumulator pairs of values accumulated at a distance of the prescribed number of sampling periods;
   obtaining a difference value of each pair of values; and
   dividing the difference value for an accumulated value of the respective coefficient.

5. The method according to claim 4, in which the calculating approximate estimations includes applying to each average on the prescribed number of sampling periods a pre-determined weight factor, to get a weighted average, and accumulating the weighted averages in an accumulator.

6. The method according to claim 1, in which the providing the scrambling scheme includes:
   a) providing a permutation law of the input signals to the DAC, in which the law has a first type of permutation and a second type of permutation mutually alternative, the first type of permutation being triggered by a first value assigned to a respective first variable, and the second type of permutation being triggered by a second value assigned to the respective first variable;
   b) grouping the permuted signals in two separated sets of signals;
   c) permuting the signals of each set on the basis of the law, depending on values assigned to respective second and third variable; and
   d) repeating the actions b) and c), permuting the signals on the basis of the law, each time as a function of values assigned to further variables, until the two separated sets contains only one signal each.

7. A device for correction of error in an output digital signal of an analog/digital converter (ADC), in which the error is introduced by a multibit digital/analog converter (DAC) incorporated in the ADC, comprising:
   scrambling means to produce, starting from input signals to the multibit DAC, scrambled input signals as a function of values assigned to a group of variable, the scrambling means having associated therewith parameters defining a transformation operated by the scrambling means;
   means for assigning to the variables substantially uncorrelated values;
   calculation means for calculating, on the basis of the parameters, of the substantially uncorrelated values and of the scrambled signals, coefficients of a linear combination of vectors of a vector space, the linear combination of vectors corresponding to a vector of the vector space representative of the error introduced by the DAC;
   correlation means for calculating the correlation of a signal containing the error introduced by the multibit DAC with each coefficient of the linear combination of vectors, to extract estimations of each of the vectors; and
   means for calculating a linear combination representative of the estimation of the error introduced by the multibit DAC and to correct the ADC output signal on the basis of the estimation of the error.

8. A computing system comprising:
   at least one analog/digital converter (ADC), each including a multibit digital/analog converter (DAC); and
   at least one device, each being electrically coupled with a respective one of the at least one ADC, for correction of error in an output digital signal of the respective one of the at least one ADC, in which the error is introduced by the multibit DAC included in the respective one of the at least one ADC, each of the at least one device comprising:
   scrambling means to produce, starting from input signals to the multibit DAC included in the respective one of the at least one ADC, scrambled input signals as a function of values assigned to a group of variable, the scrambling means having associated therewith parameters defining a transformation operated by the scrambling means;
   means for assigning to the variables substantially uncorrelated values;
   calculation means for calculating, on the basis of the parameters, of the substantially uncorrelated values and of the scrambled signals, coefficients of a linear combination of vectors of a vector space, the linear combination of vectors corresponding to a vector of the vector space representative of the error introduced by the multibit DAC included in the respective one of the at least one ADC;
   correlation means for calculating the correlation of a signal containing the error introduced by the multibit DAC included in the respective one of the at least one ADC with each coefficient of the linear combination of vectors, to extract estimations of each of the vectors; and
   means for calculating a linear combination representative of the estimation of the error introduced by the multibit DAC and to correct the error in the output digital signal of the respective one of the at least one ADC on the basis of the estimation of the error.

* * * * *